(12) United States Patent
Song

(10) Patent No.: US 10,879,854 B2
(45) Date of Patent: Dec. 29, 2020

(54) UNIVERSAL MEMORY-BASED MODEL FOR NONLINEAR POWER AMPLIFIER BEHAVIORS

(71) Applicant: SKYWORKS SOLUTIONS, INC., Irvine, CA (US)

(72) Inventor: Young-Youl Song, Moorpark, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/258,436

(22) Filed: Jan. 25, 2019

(65) Prior Publication Data

US 2019/0238101 A1 Aug. 1, 2019

Related U.S. Application Data

(60) Provisional application No. 62/622,686, filed on Jan. 26, 2018.

(51) Int. Cl.
| | |
|---|---|
| *H04B 1/04* | (2006.01) |
| *H03F 1/32* | (2006.01) |
| *H03F 3/24* | (2006.01) |
| *H03F 3/19* | (2006.01) |
| *G06F 30/20* | (2020.01) |

(52) U.S. Cl.
CPC ........... *H03F 1/3241* (2013.01); *G06F 30/20* (2020.01); *H03F 3/19* (2013.01); *H03F 3/245* (2013.01); *H04B 1/0483* (2013.01); *H03F 2200/129* (2013.01); *H03F 2200/451* (2013.01); *H03F 2201/3209* (2013.01); *H04B 2001/0425* (2013.01)

(58) Field of Classification Search
CPC ............. H03F 1/3241; H03F 2200/129; H03F 2200/451; H03F 2201/3209; H03F 3/245; H03F 3/19; H04B 2001/0425; H04B 1/0483; G06F 30/20
See application file for complete search history.

(56) References Cited

U.S. PATENT DOCUMENTS

| | | | |
|---|---|---|---|
| 8,331,480 B2 * | 12/2012 | Zheng | H04L 27/2605 370/336 |
| 2003/0025561 A1 * | 2/2003 | Hoheisel | H03F 1/0244 330/302 |
| 2007/0129025 A1 | 6/2007 | Vasa et al. | |
| 2008/0051042 A1 | 2/2008 | Komaili et al. | |
| 2014/0312974 A1 | 10/2014 | Khesbak et al. | |
| 2015/0078484 A1 * | 3/2015 | Xiao | H03F 1/3247 375/297 |

(Continued)

*Primary Examiner* — Nhan T Le
(74) *Attorney, Agent, or Firm* — Knobbe, Martens, Olson & Bear, LLP

(57) ABSTRACT

A method for modelling a power amplifier, including memory effect modelling, for general input waveforms and power levels involves generating an extraction waveform having a plurality of tones each having a different frequency, a difference between the frequencies of two adjacent tones of the plurality of tones not being an integer multiple of a difference in frequency between any two other adjacent tones of the plurality of tones. The method further involves providing the extraction waveform to the power amplifier, receiving output from the power amplifier generated in response to the extraction waveform, and generating a model of the power amplifier based on the output.

20 Claims, 8 Drawing Sheets

(56) References Cited

U.S. PATENT DOCUMENTS

| | | |
|---|---|---|
| 2015/0172081 A1 | 6/2015 | Wloczysiak |
| 2015/0333781 A1 | 11/2015 | Alon et al. |
| 2016/0013758 A1 | 1/2016 | Cao et al. |
| 2016/0028432 A1 | 1/2016 | Zhang et al. |
| 2016/0241194 A1 | 8/2016 | Lehtola |
| 2016/0261239 A1 | 9/2016 | Khesbak et al. |
| 2016/0261241 A1* | 9/2016 | Hammi ................ H03F 1/3258 |
| 2017/0005694 A1 | 1/2017 | Zhang et al. |
| 2017/0040958 A1 | 2/2017 | Cao et al. |
| 2017/0052553 A1 | 2/2017 | Gebeyehu et al. |
| 2017/0133988 A1 | 5/2017 | Rogers |
| 2017/0141734 A1 | 5/2017 | Lehtola |
| 2017/0179889 A1 | 6/2017 | Khesbak et al. |
| 2017/0250727 A1 | 8/2017 | Lehtola |
| 2018/0120881 A1 | 5/2018 | Gebeyehu et al. |
| 2018/0248523 A1 | 8/2018 | Rogers |
| 2018/0343029 A1 | 11/2018 | Zhang et al. |
| 2018/0367171 A1* | 12/2018 | Jacob ..................... H03F 1/223 |
| 2019/0165738 A1 | 5/2019 | Pan et al. |
| 2019/0165739 A1 | 5/2019 | Lyalin et al. |
| 2019/0243403 A1 | 8/2019 | Gebeyehu et al. |
| 2019/0386621 A1 | 12/2019 | Alon et al. |
| 2020/0044609 A1 | 2/2020 | Lehtola |
| 2020/0136670 A1 | 4/2020 | Zhang et al. |
| 2020/0228064 A1 | 7/2020 | Datta et al. |

\* cited by examiner

UNIVERSAL MEMORY-BASED MODEL FOR NONLINEAR POWER AMPLIFIER BEHAVIORS

BACKGROUND

Field

Embodiments of the described technology relate to electronic systems, and in particular, to systems including power amplifiers for radio frequency (RF) electronics.

Description of the Related Technology

Power amplifiers can be included in mobile devices to amplify an RF signal for transmission via an antenna. For example, in mobile devices having a time division multiple access (TDMA) architecture, such as those found in Global System for Mobile Communications (GSM), code division multiple access (CDMA), wideband code division multiple access (W-CDMA) systems, long term evolution (LTE) systems, and new radio (NR) 5G systems, a power amplifier can be used to amplify an RF signal having a relatively low power. Power amplifiers can be included in mobile device front end modules that also include duplexers, antenna switch modules, and couplers. Modern front end modules can experience significant performance impairment under certain circumstances, including degraded linearity and memory effects.

SUMMARY

To address the degradation in linearity and the memory effects of a power amplifier, certain techniques can be used to extract a model of the linearity and memory effects of the power amplifier. The model can then be used to pre-distort input signals prior to be provided to the power amplifier to compensate for the non-linearity and memory effects of the power amplifier. Certain techniques used to extract the power amplifier model may be limited to the waveform and power level of the input signal used in extracting the model. Thus, the model may not adequately compensate for input signals having a substantially different waveform and/or power level. It may be desirable to produce a model that can be more generally used for different input waveforms and at different power levels without requiring additional extraction using an updated input signal.

Aspects of this disclosure relate to techniques and input waveforms which can be used to extract a power amplifier model which addresses the above limitations. For example, in one aspect, a universal memory-based model can be extracted for a power amplifier which can be used for a variety of waveforms and power levels. In particular, a method for modelling a power amplifier is provided according to at least one aspect of the disclosure. The method includes generating an extraction waveform having a plurality of tones each having a different frequency, a difference between the frequencies of two adjacent tones of the plurality of tones not being an integer multiple of a difference in frequency between any two other adjacent tones of the plurality of tones. The method further includes providing the extraction waveform to the power amplifier; receiving output from the power amplifier generated in response to the extraction waveform; and generating a model of the power amplifier based on the output.

A power amplifier modelling system is provided according to another aspect of the disclosure. The system includes a signal generator configured to generate an extraction waveform having a plurality of tones each having a different frequency, a difference between the frequencies of two adjacent tones of the plurality of tones not being an integer multiple of a difference in frequency between any two other adjacent tones of the plurality of tones. The system further includes a power amplifier configured to receive the extraction waveform; and model extraction hardware configured to receive output from the power amplifier generated in response to the extraction waveform, and generate a model of the power amplifier based on the output.

A mobile device is provided according to yet another aspect of the disclosure. The mobile device includes a modulator configured to generate a radio frequency transmit signal; and a power amplifier configured to amplify a digitally pre-distorted radio frequency transmit signal to generate an amplified radio frequency signal. The mobile device also includes digital pre-distortion hardware configured to receive the radio frequency transmit signal, apply digital pre-distortion to the radio frequency transmit signal based on the inverse of a model of the power amplifier, and generate the digitally pre-distorted radio frequency transmit signal, the model of the power amplifier generated using an extraction waveform comprising a plurality of tones each having a different frequency, a difference between the frequencies of two adjacent tones of the plurality of tones not being an integer multiple of a difference in frequency between any two other adjacent tones of the plurality of tones. The mobile device further includes an antenna configured to receive the amplified radio frequency signal from the front end module; and a non-volatile memory storing the inverse of the model of the power amplifier

DETAILED DESCRIPTION

The headings provided herein, if any, are for convenience only and do not necessarily affect the scope or meaning of the claimed invention.

Overview of Communication Network

Figure 1:
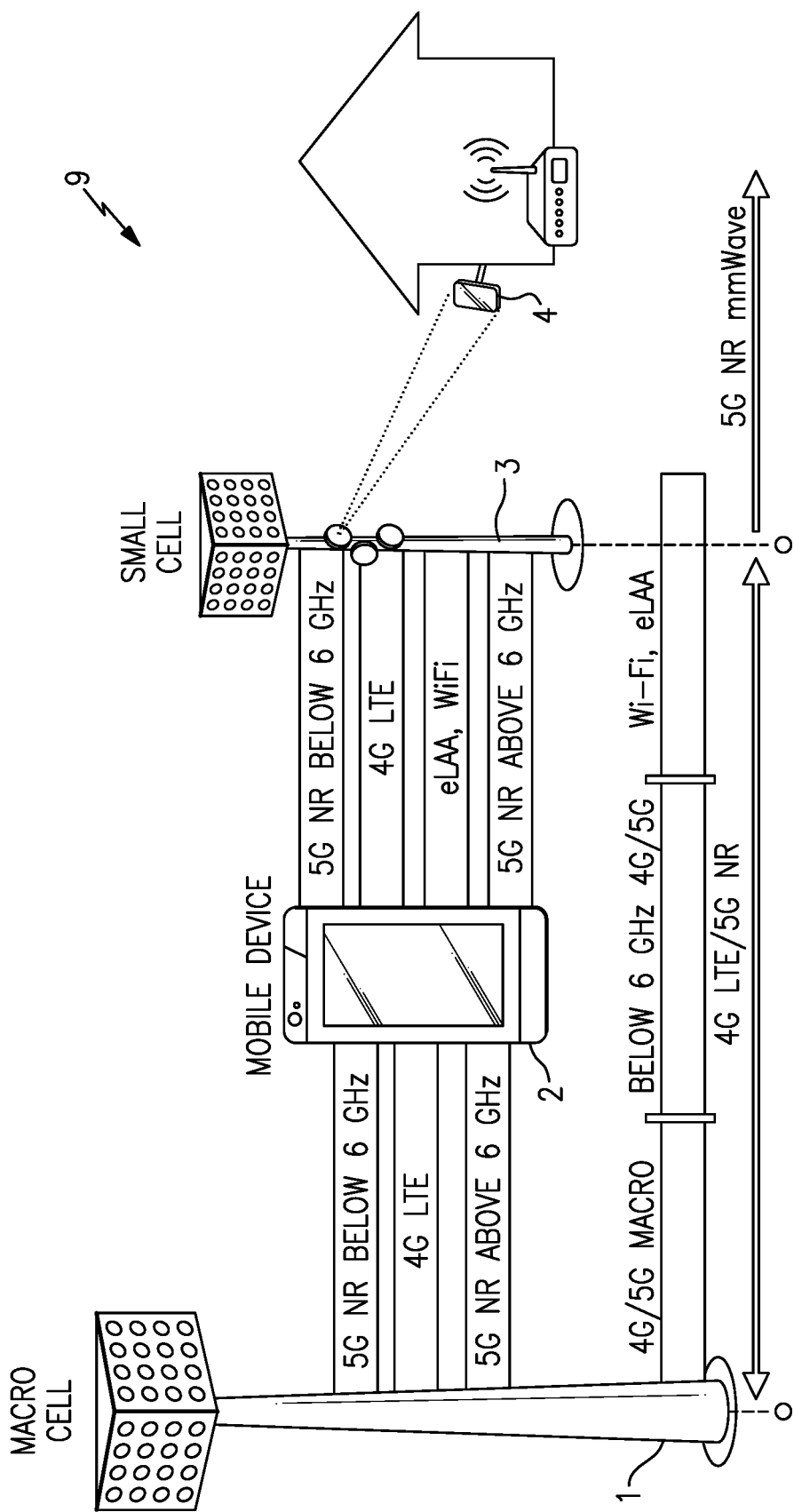
FIG. 1 is a schematic diagram of one example of a communication network.

FIG. 1 is a schematic diagram of one example of a communication network 9. The communication network 9 includes a macro cell base station 1, a mobile device 2, a small cell base station 3, and a stationary wireless device 4.

The illustrated communication network 9 of FIG. 1 supports communications using a variety of technologies, including, for example, 4G LTE, 5G NR, and wireless local area network (WLAN), such as Wi-Fi. Although various examples of supported communication technologies are shown, the communication network 9 can be adapted to support a wide variety of communication technologies.

Various communication links of the communication network 9 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

As shown in FIG. 1, the mobile device 2 communicates with the macro cell base station 1 over a communication link that uses a combination of 4G LTE and 5G NR technologies. The mobile device 2 also communications with the small cell base station 3. In the illustrated example, the mobile device 2 and small cell base station 3 communicate over a communication link that uses 5G NR, 4G LTE, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

In certain implementations, the mobile device 2 communicates with the macro cell base station 2 and the small cell base station 3 using 5G NR technology over one or more frequency bands that are less than 6 Gigahertz (GHz) and/or over one or more frequency bands that are greater than 6 GHz. In one embodiment, the mobile device 2 supports a HPUE power class specification.

The illustrated small cell base station 3 also communicates with a stationary wireless device 4. The small cell base station 3 can be used, for example, to provide broadband service using 5G NR technology. In certain implementations, the small cell base station 3 communicates with the stationary wireless device 4 over one or more millimeter wave frequency bands in the frequency range of 30 GHz to 300 GHz and/or upper centimeter wave frequency bands in the frequency range of 24 GHz to 30 GHz.

In certain implementations, the small cell base station 3 communicates with the stationary wireless device 4 using beamforming. For example, beamforming can be used to focus signal strength to overcome path losses, such as high loss associated with communicating over millimeter wave frequencies.

The communication network 9 of FIG. 1 includes the macro cell base station 1 and the small cell base station 3. In certain implementations, the small cell base station 3 can operate with relatively lower power, shorter range, and/or with fewer concurrent users relative to the macro cell base station 1. The small cell base station 3 can also be referred to as a femtocell, a picocell, or a microcell.

Although the communication network 9 is illustrated as including two base stations, the communication network 9 can be implemented to include more or fewer base stations and/or base stations of other types.

The communication network 9 of FIG. 1 is illustrated as including one mobile device and one stationary wireless device. The mobile device 2 and the stationary wireless device 4 illustrate two examples of user devices or user equipment (UE). Although the communication network 9 is illustrated as including two user devices, the communication network 9 can be used to communicate with more or fewer user devices and/or user devices of other types. For example, user devices can include mobile phones, tablets, laptops, IoT devices, wearable electronics, and/or a wide variety of other communications devices.

User devices of the communication network 9 can share available network resources (for instance, available frequency spectrum) in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user device a unique code, space-divisional multiple access (SDMA) in which beamforming is used to provide shared access by spatial division, and non-orthogonal multiple access (NOMA) in which the power domain is used for multiple access. For example, NOMA can be used to serve multiple user devices at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 9 of FIG. 1 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to $M*B*\log_2(1+S/$ N), where M is the number of communication channels, B is the channel bandwidth, and S/N is the signal-to-noise ratio (SNR).

Accordingly, data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

Figure 2A:
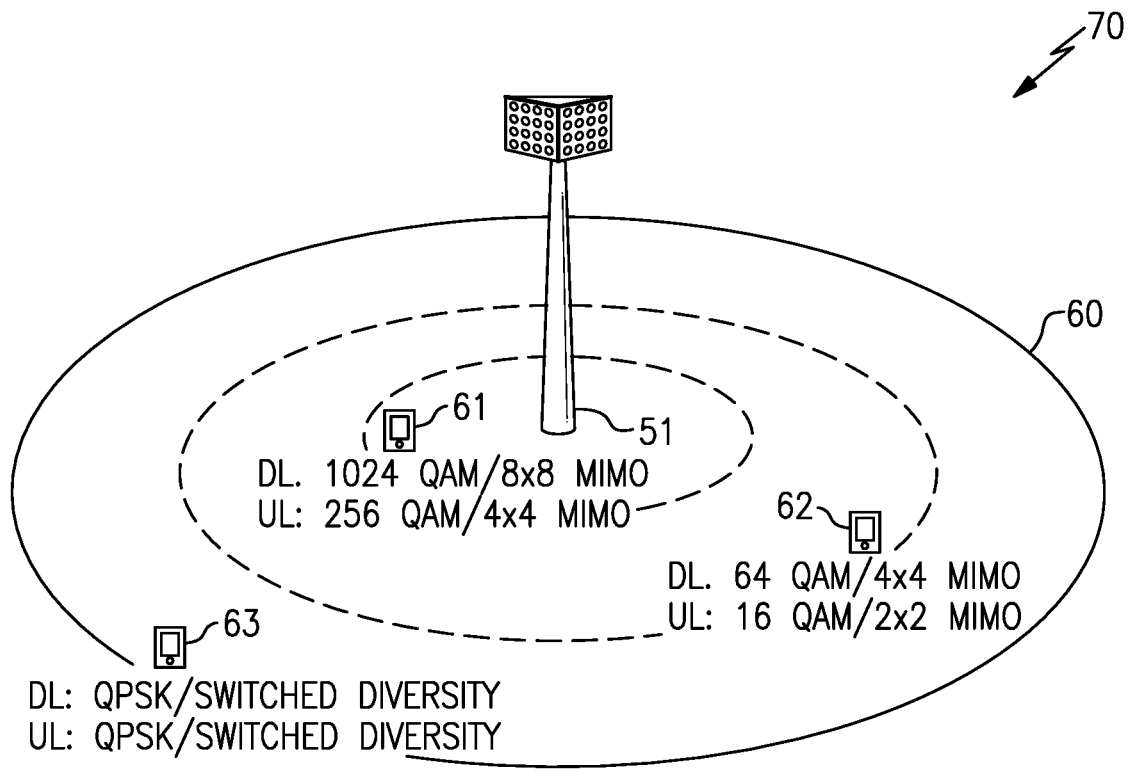
FIG. 2A is a schematic diagram of another example of a communication network.

FIG. 2A is a schematic diagram of another example of a communication network 70. The communication network 70 includes a base station 41 and various mobile devices 61-63. The base station 51 serves a land area or cell 60. Additionally, the mobile devices 61-63 are located in different locations of the cell 60 associated with different distances to the base station 51.

Although one example of a communication network is shown, other configurations are possible, including, for example, communication networks with other numbers and/or types of user devices and/or base stations.

Figure 2B:
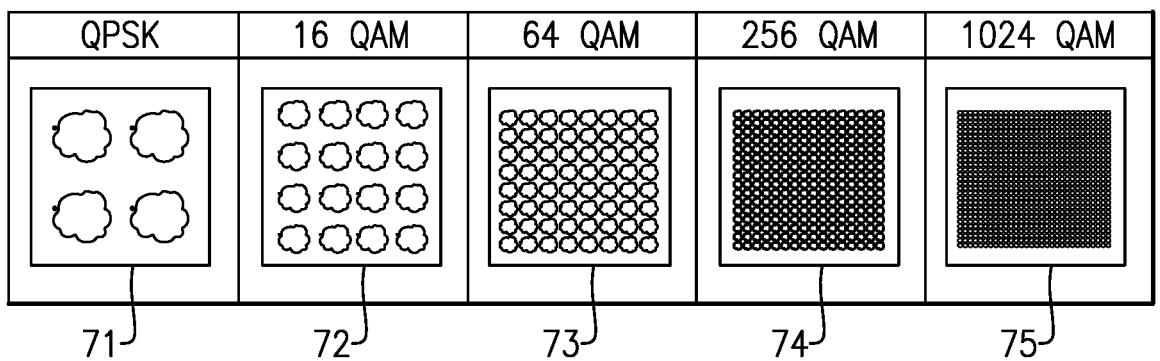
FIG. 2B is a schematic diagram illustrating various examples of signal modulation for a communication network.

FIG. 2B is a schematic diagram illustrating various examples of signal modulation for a communication network, such as the communication network 70 of FIG. 2A.

Various constellation diagrams are depicted in FIG. 2B, including a quadrature phase shift keying (QPSK) constellation diagram 71, a 16 Quadrature Amplitude Modulation (QAM) constellation diagram 72, a 64 QAM constellation diagram 73, a 256 QAM constellation diagram 74, and a 1024 QAM constellation diagram 75.

The constellation diagrams 71-75 each illustrate a complex plane including possible symbols that can be selected for the associated modulation scheme.

For example, QPSK modulation includes four symbols, each corresponding to one of four carrier phase shifts (for instance, 0°, 90°, 180°, or 270°). QPSK can be used to carry 2 bits per symbol.

QAM modulation includes symbols having different proportions of quadrature carrier signals. For example, by changing the amplitudes of an in-phase carrier signal (for instance, a sine carrier wave) relative to a quadrature-phase carrier signal (for instance, a cosine carrier wave) different symbols can be achieved.

The number of symbols and bits per symbol changes with an order or level of QAM modulation. For example, 16 QAM includes 16 symbols, with 4 bits per symbol. Additionally, 64 QAM includes 64 symbols, with 6 bits per symbol. Furthermore, 256 QAM includes 256 symbols, with 8 bits per symbol. Additionally, 1024 QAM includes 1024 symbols, with 10 bits per symbol.

QPSK and QAM illustrate examples of modulation formats suitable for 5G communication systems. However, other types of modulation formats are possible, including, but not limited to, a wide variety of modulation formats employing frequency-shift keying (FSK), amplitude-shift keying (ASK), and/or phase-shift keying (PSK).

Advanced cellular technologies, such as LTE-Advanced Pro and 5G NR, employ complex modulation schemes to increase a number of bits per symbol or data density. By using complex modulation schemes, spectral efficiency can be increased.

Certain communication systems dynamically control modulation (for instance, a modulation format and/or level of modulation) based on a quality of a communication link.

For example, it can be difficult to receive a signal with accuracy when SNR is relatively low. Thus, as a number of symbols in a constellation increases, it can become increasing more difficult to determine which symbol has been communicated. Accordingly, certain communication systems dynamical control modulation based on SNR.

SNR is a function of a variety of factors, such as radio environment, proximity to sources of signal interference or noise, and/or quality or performance of the communication systems transmitting and receiving over the communication link.

With reference to FIGS. 2A and 2B, the mobile devices 61-63 are at varying distances from the base station 51. Additionally, the first mobile device 61 operates with a higher SNR than the second mobile device 62, which in turn operates with higher SNR than the third mobile device 63, in this example.

In certain implementations, a selected modulation format for uplink and/or downlink can be dynamically adjusted or changed based on SNR.

For instance, in the example illustrated in FIG. 2A, the first mobile device 61 with high SNR communicates with 1024 QAM for DL and 256 QAM for UL. Additionally, the second mobile device 61 with moderate SNR communicates with 64 QAM for DL and 16 QAM for UL, and the third mobile device 63 with low SNR communicates with QPSK for UL and DL. As the mobile device 61-63 move throughout the cell 60, modulation can be dynamically adapted based on SNR.

Although one specific example of modulation formats and levels for various mobile devices are shown, other modulation formats and/or levels are possible.

UE for advanced cellular technologies include multiple antennas for communications. In certain implementations, a mobile device that supports MIMO communications can also be used for switched diversity communications. In contrast to MIMO in which multiple antennas are simultaneously used for communication, switched diversity refers to communications in which a particular antenna is selected for operation at a particular time. For example, a switch can be used to select a particular antenna from a group of antennas based on a variety of factors, such as an observed bit error rate and/or a signal strength indicator.

In certain communication networks, MIMO is used when SNR is relatively high, and switched diversity is used when SNR is relatively low. For example, when a mobile device is relatively close to a base station, MIMO communications can be used to increase data rate. Additionally, when the mobile device is relatively far from the base station, switched diversity can be used to improve SNR. Thus, a mobile device including multiple antennas can dynamically change between MIMO communications and switched diversity communications based on radio environment.

For instance, in the example illustrated in FIG. 2A, the first mobile device 61 with high SNR communicates with 8×8 DL MIMO and 4×4 UL MIMO. Additionally, the second mobile device 61 with moderate SNR communicates with 4×4 DL MIMO and 2×2 UL MIMO, and the third mobile device 63 with low SNR communicates with switched diversity for both DL and UL. As the mobile device 61-63 move throughout the cell 60, the antenna usage can be dynamically adapted or changed based on SNR.

Although one specific example of multiple antenna control for various mobile devices is shown, other examples are possible.

Power Amplifier Module and Wireless Device

Figure 3:
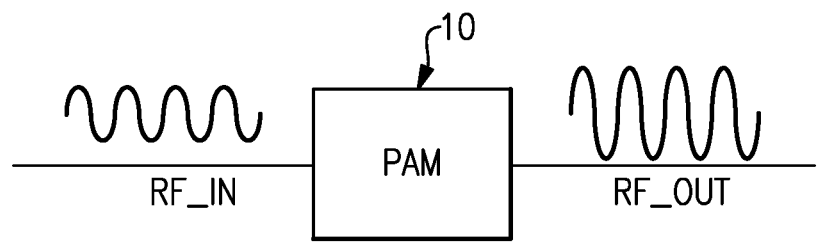
FIG. 3 is a schematic diagram of a power amplifier module for amplifying a radio frequency (RF) signal.

FIG. 3 is a schematic diagram of a power amplifier module (PAM) 10 for amplifying a radio frequency (RF) signal. The illustrated power amplifier module 10 can be configured to amplify an RF signal RF_IN to generate an amplified RF signal RF_OUT. As described herein, the power amplifier module 10 can include one or more power amplifiers.

Figure 4:
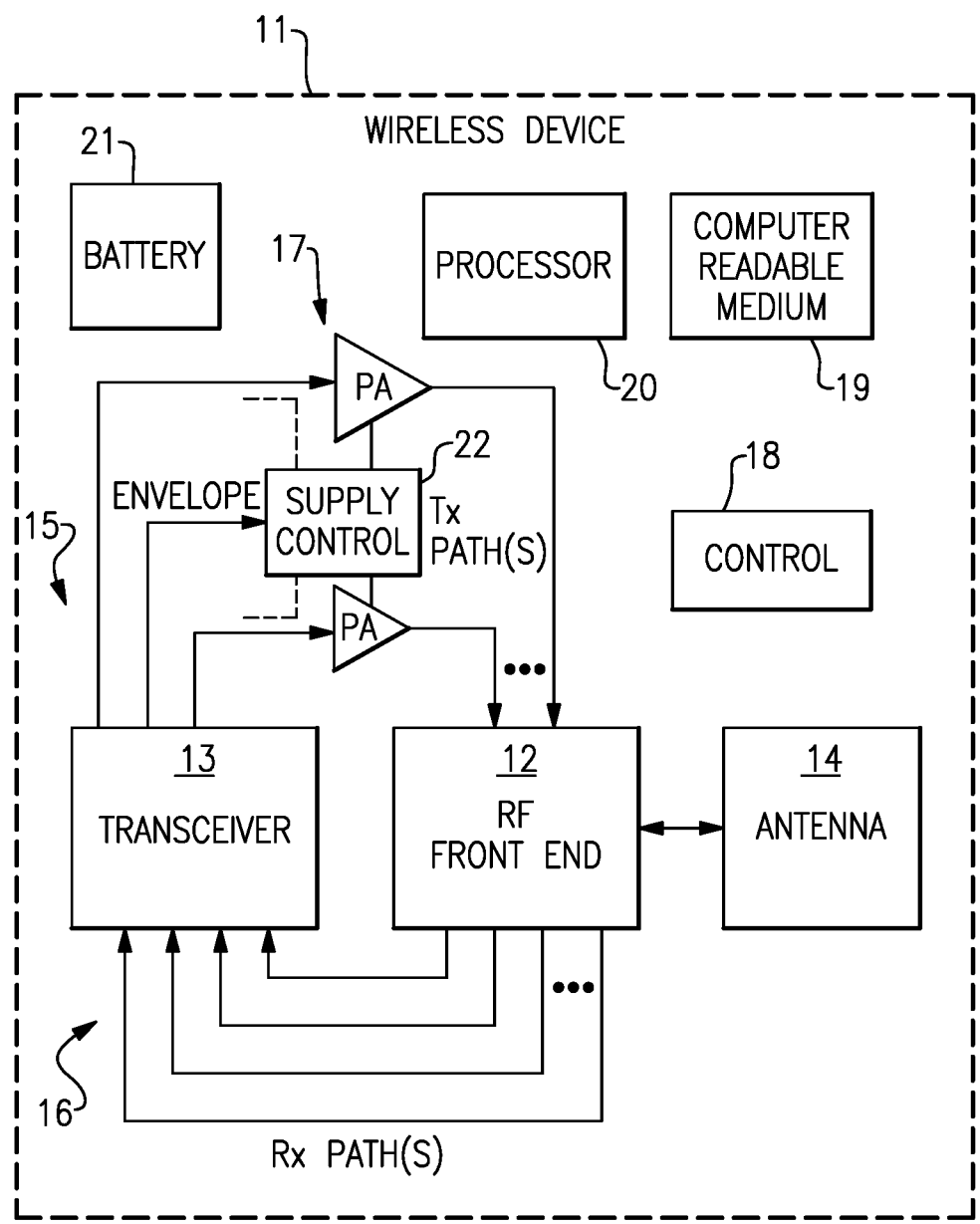
FIG. 4 is a schematic block diagram of an example wireless device.

FIG. 4 is a schematic block diagram of an example wireless device 11 that can include one or more of the power amplifier modules 10 of FIG. 3. The wireless device 11 can include power amplifiers 17 and an RF front end 12 implementing one or more features of the present disclosure. For instance, the power amplifiers 17 and RF front end 12 according to some embodiments are configured to compensate for non-linearities, including those caused by memory effects resulting from impedance mismatch seen by the power amplifiers 17. In particular, duplexers coupled to the output power amplifiers 17 can include or operate as filters that add corresponding frequency response components to the system on top of other distortion, creating memory effects. For instance, duplexers can present mismatch that is not flat across transmit channel/band, causing non-linear power amplifier behavior.

Such compensation can involve the utilization of a lookup table or other data structure, where appropriate lookup table entries are access based on measurements taken during operation, such as voltage standing wave ratio (VSWR) measurements or other measurements relating to complex impedance seen by the power amplifiers 17. Values in the lookup table according to certain implementations can be obtained during a characterization phase, where a programmable tuneable load is used to record certain variables characterizing the behavior of the system.

While the power amplifiers 17 and RF front end 12 are described in some cases as separate components, some or all of the power amplifiers 17 can also form part of the RF front end 12, such as in embodiments where the RF front end 12 is a highly integrated component that includes the power amplifiers 17. The combination of the power amplifiers 17 and RF front end 12 can together be referred to as a front end module.

The example wireless device 11 depicted in FIG. 4 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA), WCDMA, LTE, and NR are other standards, that can be implemented in mobile phone devices.

One or more features of the present disclosure can be implemented in the foregoing example modes and/or bands, and in other communication standards. For example, 3G and 4G are non-limiting examples of such standards.

The illustrated wireless device 11 includes a RF front end 12, a transceiver 13, an antenna 14, power amplifiers 17, a control component or controller 18, a computer-readable medium 19, a processor 20, a battery 21, and a supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 4 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 4 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 4, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 4 illustrates the wireless device 11 as including two transmission paths 15, the wireless device 11 can be adapted to include more or fewer transmission paths 15.

In FIG. 4, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 4 illustrates the wireless device 11 as including four receiving paths 16, the wireless device 11 can be adapted to include more or fewer receiving paths 16.

To facilitate switching between receive and transmit paths, the one or more switches in the RF front end 12 can be configured to electrically connect the antenna 14 to a selected transmit or receive path. Thus, the switches can provide a number of switching functionalities associated with operation of the wireless device 11. In certain embodiments, the switches can include a number of switches configured to provide functionalities associated with, for example, switching between different bands, switching between different power modes, switching between transmission and receiving modes, or some combination thereof. The switches can also be configured to provide additional functionality, including filtering and/or duplexing of signals.

FIG. 4 shows that in certain embodiments, a control component 18 can be provided for controlling various control functionalities associated with operations of the RF front end, the power amplifiers 17, the supply control 22, and/or other operating components. The control component 18 can in some cases be included within another component shown in FIG. 4, such as the transceiver 13, for example.

In certain embodiments, a processor 20 can be configured to facilitate implementation of various processes described herein. In certain implementations, the processor 20 can operate using computer program instructions. In certain embodiments, these computer program instructions may also be stored in a computer-readable memory 19 that can direct a computer or other programmable data processing apparatus to operate in a particular manner. For example, for the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The supply control block 22 can be electrically connected to the battery 21, and the supply control block 22 can be configured to change the voltage provided to the power amplifiers 17. The battery 21 can be any suitable battery for use in the wireless device 11, including, for example, a lithium-ion battery. As illustrated in FIG. 4, an envelope signal can be provided to the supply control block 22 from the transceiver 13. The envelope can be determined according to different techniques. For example, the envelope or other type of supply control signal can be determined by processing the RF signal (e.g., detecting the envelope using any suitable envelope detector).

Power Amplifier Modeling and Distortion Compensation

Development in wireless protocols has been shaped in part by demand for higher data rates. For example, certain proposals for the 5G standard include supporting up to 400 MHz instantaneous signal bandwidth for all carriers below 6 GHz and up to 1.2 GHz instantaneous signal bandwidth higher than 6 GHz up to 40 GHz.

The demand for higher data rates can require wireless protocols to increase the instantaneous bandwidths of the transmitted (and received) signals. This increase in instantaneous bandwidth can result in the signal's bandwidth becoming so large that the active devices that functionally amplify and signal condition these signals starts to suffer from an increase in "memory effect." Due to the memory effect, the characteristics of the amplified signal can degrade and out-of-channel emissions may become a challenge in order to meet coexistence and regulatory requirements.

As used herein, "memory effect" may generally refer to a source of distortion in an amplified signal where the instantaneous value of the amplified signal depends on not only the instantaneous input value at the same moment in time (as in an ideal amplifier), but also on a certain amount of history of the value of the amplified signal. As the distortion due to the memory effect increases (e.g., the value of amplified signal depends more on the history of the amplified signal), the memory effect begins to corrupt the desired amplified output signal and causes degradation in in-band distortion (error vector magnitude (EVM) degradation) and causes higher levels of out-of-channel modulation emissions in the form of spectral regrowth. An example where memory effects becomes critical is in the 5G standard.

The integrity of amplification without distortion of wide bandwidth signals proses a significant challenge. In order to address this challenge, it may be necessary to represent devices with nonlinear models that accurately represent not only the intrinsic nonlinearity, but also the memory mechanisms (e.g., memory effects) and resulting memory-based degradations. Certain approaches to memory-based power amplifier model extraction involve adaptive digital closed-loop correction to iteratively converge through least means squares (LMS) method to adjust the parameters of the amplifier such that an "ideal" output signal can be reconstructed post-amplifier. Based on the extracted model, a memory-based digital pre-distortion (DPD) technique may be applied in which signals can be pre-distorted before being provided to the modeled nonlinear amplifier. The DPD required can be represented as an inverse of the amplifier nonlinearity and memory behavior, thereby compensating for the expected nonlinearity and memory effects of the amplifier before the signal is provided to the amplifier.

One major challenge to the above-described approach to modeling the nonlinear and memory-based behavior of an amplifier is that the resulting amplifier model (and corresponding inverse DPD) only represent the particular waveform provided to the amplifier during the extraction of the model. Similarly, the model may be only representative of the nonlinearities and memory effects of the amplifier at that specific power level of the provided input. When materially different input waveform, having one or more of a difference in bandwidth, modulation allocation, peak-to-average and/or carrier statistic is provided to the amplifier, then the resulting amplified output signal may not be accurate. Thus, the model may be not predictive for waveforms and power levels other than for the specific waveform used to extract the model. As a result, current adaptive memory models cannot be used for general power amplifier modelling, which should not involve an adaptive loop, and are only used for adaptive DPD modelling specific to a given waveform and a given power level.

Accordingly, aspects of this disclosure relate to systems and techniques for accurately modeling and compensating for memory effects of a power amplifier without being limited to a specific input waveform and/or power level under which extraction of an amplifier model is performed.

Figure 5:
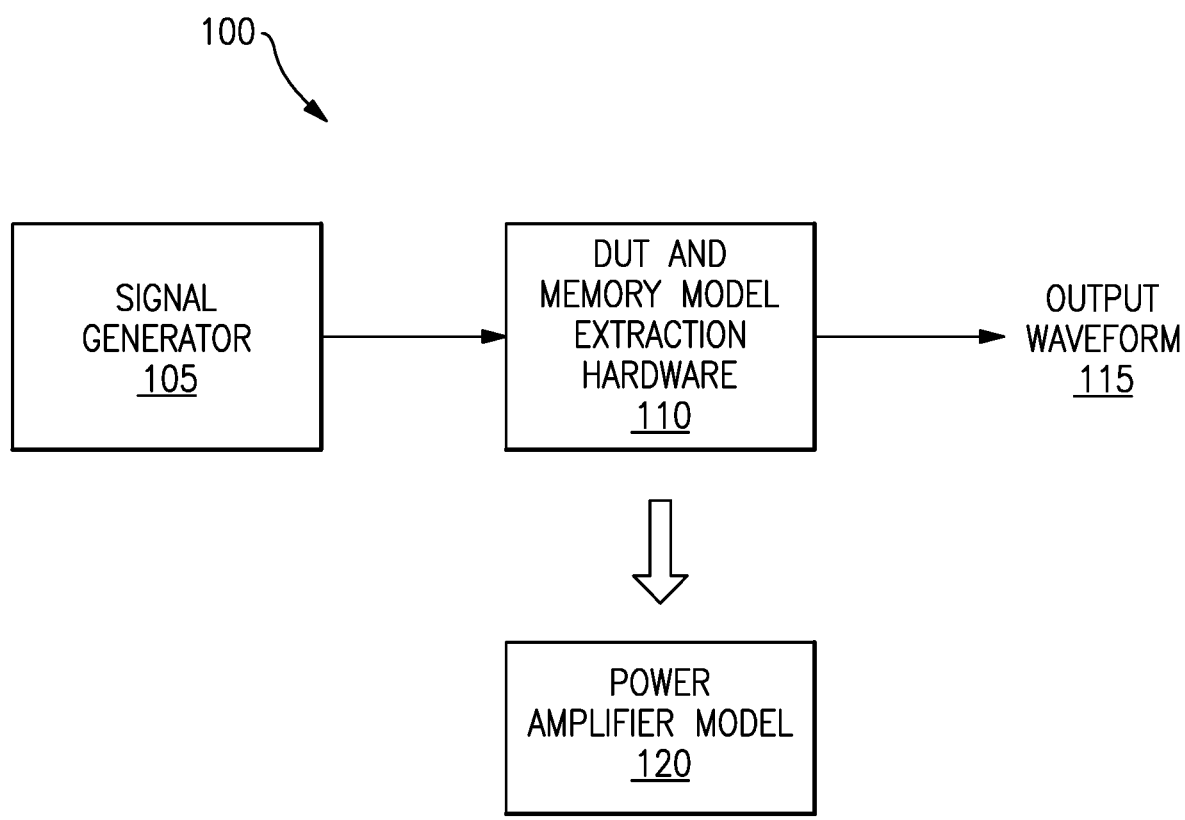
FIG. 5 is a schematic block diagram of one example of a power amplifier model extraction system according to certain embodiments.
Figure 6A:
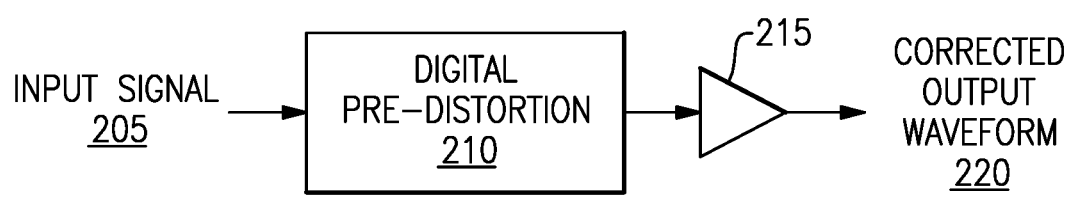
FIG. 6A is a schematic block diagram of one example of a digital pre-distortion (DPD) system according to certain embodiments.

A generic technique for modeling a power amplifier and applying DPD to the power amplifier will be discussed in connection with FIGS. 5 and 6. FIG. 5 is a schematic block diagram of one example of a power amplifier model extraction system according to certain embodiments. FIG. 6A is a schematic block diagram of one example of a digital pre-distortion (DPD) system according to certain embodiments.

Figure 6B:
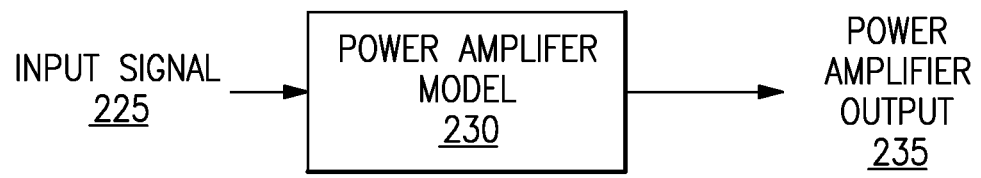
FIG. 6B is a schematic block diagram of one example of a power amplifier response simulation system according to certain embodiments.

FIG. 6B is a schematic block diagram of one example of a power amplifier response simulation system according to certain embodiments.

The system 100 illustrated in FIG. 5 includes a signal generator 105 and device under test (DUT) and memory model extraction hardware 110. The illustrated system may perform one of a number of device modelling techniques, which may define the type of input signal generated by the signal generator 105 used to model the DUT (e.g., the power amplifier).

The signal generator 105 generates an input signal which is provided to the DUT and memory model extraction hardware 110. The DUT (e.g., the power amplifier) amplifies the input signal to generate the output waveform 115. Based on the received input signal and the output waveform 115, the memory model extraction hardware 110 may generate a power amplifier model 120 which can be used to compensate for the non-linearity and memory effects of the power amplifier. Specifically, the inverse of the power amplifier model 120 can be taken which then can be applied as digital pre-distortion (DPD) to compensate for the non-linearity and memory effects of the power amplifier.

As shown in FIG. 6A for an example DPD application, an input signal 205 is provided to digital pre-distortion block 210 before being applied to the power amplifier 215. The digital pre-distortion block 210 may apply the inverse of the power amplifier model 120 determined by the DUT and memory model extraction hardware 110 of FIG. 5. The power amplifier 215 outputs a corrected output waveform 220. As shown in FIG. 6B for an example power amplifier modelling and simulation application, an input signal 225 is provided to a power amplifier model block 230 to produce a simulated power amplifier output waveform.

Certain power amplifier/DPD modelling techniques exist for modulated waveforms such as circuit envelope, AMAM/AMPM, X parameter, memory model, etc. These techniques may have limitations for power amplifier modelling, for DPD modelling, or for both. Circuit envelope may be used for power amplifier modelling but does not account for memory effects. X parameter may also be used for power amplifier modelling, but it takes very long time to extract the parameters, and therefore presents certain drawbacks related to the amount of time required for modelling when repeated model extractions are needed during product optimization. AMAM/AMPM may be used for both power amplifier modelling and DPD modelling, but AMAM/AMPM can only be used for narrow bandwidths and is sensitive to power amplifier gain changes due to environmental conditions. Adaptive memory model may be good for wide bandwidths because adaptive memory model can be used to handle memory effects. However, adaptive memory model can only be used with an adaptive loop DPD and cannot be used for general power amplifier modelling.

For DPD modelling, AMAM/AMPM models and adaptive memory models are practically used techniques. The AMAM/AMPM model may involve determining the change in gain and the change in phase for a given input power in response to applying an input signal to the power amplifier. An example AMAM/AMPM model of an example power amplifier is shown below in table 1. The values provided in table 1 are merely exemplary and the specific values for the AMAM/AMPM model of a given power amplifier would be determined based on the output of the power amplifier in response to an input signal by the memory model extraction hardware 110. Further, table 1 is truncated, showing only a small number of input power entries. In certain implementations, the AMAM/AMPM model will include greater or fewer entries depending on the intended range of input powers at which the power amplifier is intended to operate.

TABLE 1

| Input Power (dBm) | Gain (dB) | Phase |
|---|---|---|
| −25.5 | 26.22 | 28.59 |
| −25.4 | 26.22 | 28.6 |
| −25.3 | 26.22 | 28.6 |
| −25.2 | 26.22 | 28.61 |
| −25.1 | 26.22 | 28.62 |
| −25 | 26.22 | 28.62 |
| −24.9 | 26.22 | 28.62 |
| −24.8 | 26.22 | 28.63 |
| −24.7 | 26.21 | 28.63 |
| −24.6 | 26.21 | 28.63 |
| −24.5 | 26.21 | 28.63 |
| −24.4 | 26.21 | 28.63 |
| −24.3 | 26.21 | 28.63 |
| −24.2 | 26.21 | 28.63 |
| −24.1 | 26.2 | 28.63 |
| −24 | 26.2 | 28.63 |
| −23.9 | 26.2 | 28.62 |
| −23.8 | 26.2 | 28.61 |
| ... | ... | ... |

In order to compensate for the non-linearity of the example power amplifier, the inverse of the AMAM/AMPM model can be determined and applied to an input signal 205 in digital pre-distortion block 210. Thus, the non-linearity of the power amplifier 215 will be compensated based on the DPD applied to the input signal.

Figure 7:
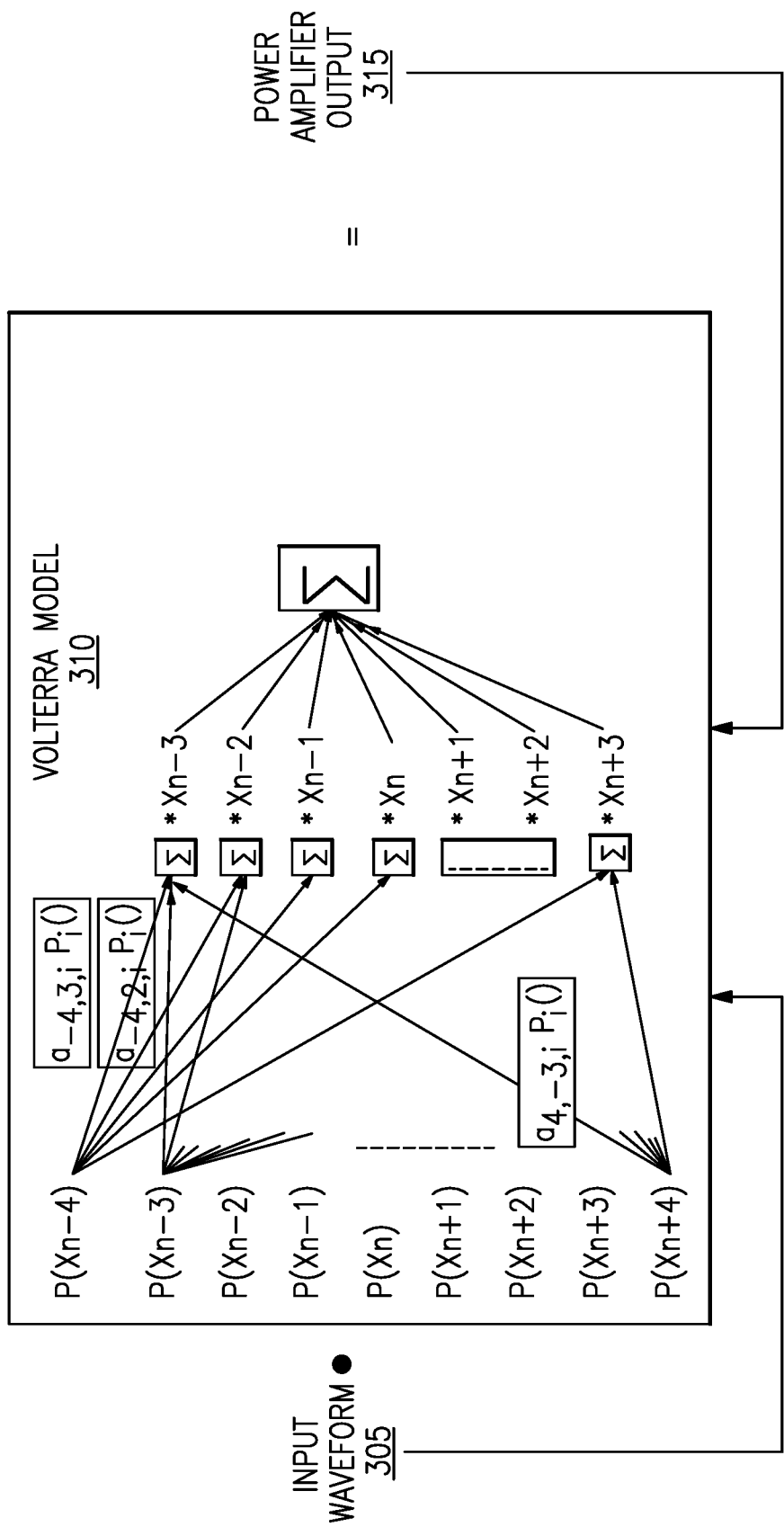
FIG. 7 is a schematic block diagram of one example of an Adaptive Memory model according to certain embodiments.

Another example technique involves generating an Adaptive Memory model of the power amplifier. FIG. 7 is a schematic block diagram of one example of an Adaptive Memory model according to certain embodiments. The Adaptive Memory model is more complex than the AMAM/AMPM model and can handle memory effects under certain circumstances. The Adaptive Memory model 310 is a model of the power amplifier applied to the input waveform 305 to produce power amplifier output 315. The equations illustrated in the Adaptive Memory model 310 box of FIG. 7 is a visualization of the following equation:

$$y(n) = \Sigma_{k=0}^{K} \Sigma_{l=0}^{L} \Sigma_{i=0}^{N} a_{k,l,i} P_i(x(n-k), |x(n-l)|^2) \quad (1)$$

Where $P_i(x)$ is a polynomial function operator, X is a sample of the input waveform 305 at time (n−k) or (n−l), coefficients $a_{k,l,i}$ are determined through an LMS method, k and l are the memory order, i is a non-linearity order, and y(n) is the power amplifier output 315 at time n. The coefficients $a_{k,l,i}$ can be continually updated as the power amplifier receives updated input waveforms 305. In order to perform digital pre-distortion 210 (see FIG. 6A), the Adaptive Memory model 310 can be inverted through numerical iteration.

There are a number of limitations the AMAM/AMPM model and the Adaptive Memory model. For example, the AMAM/AMPM model can only be used for narrow bandwidth signals and cannot compensate for memory effects of the power amplifier. AMAM/AMPM DPD also requires gain compensation before applying the lookup table because a transmitter gain usually varies over environmental conditions. One of the drawbacks of the Adaptive Memory model is that the technique cannot be used to extract a general power amplifier model, which can be used to receive general waveforms and power levels at the input. Therefore, the Adaptive Memory model is typically only used for adaptive DPD. That is, the Adaptive Memory model is continuously updated through iteratively calculating the coefficients $a_{k,l,i}$ using the histories of the output of the DPD compensated power amplifier 315 and the input waveform 305 as inputs to the Adaptive Memory model 310. However, the Adaptive Memory model approaches require the continual calculation of the coefficients $a_{k,l,i}$ during the use of the power amplifier to maintain the accuracy of the system, and thus, lead to extra power consumption by the power amplifier system, extra hardware and space, and potential robustness issues due to poor convergence caused by extraordinary environmental conditions.

One aspect of this disclosure therefore relates to a "universal test waveform," which can be used in a technique similar to the Adaptive Memory model to extract a power amplifier model, but the extracted model can be used for an arbitrary input waveforms without requiring further adaptation in a closed loop. This leads to the added benefit of the ability to compensate for input signals over a wide bandwidth and compensate for memory effects (e.g., similar to the Adaptive Memory model) in an open loop operation. The use of the universal memory model (UMM) extracted power amplifier model enables the UMM technique to compensate input signals without continually updating the model coefficients, thereby reducing power consumption and hardware complexity.

The fundamental technique used to model the power amplifier using the UMM technique may be substantially similar to the Adaptive Memory model. For example, the UMM output signal may be modeled using the following equation for the memory polynomial:

$$z(n) = \sum_{k=1}^{K} \sum_{q=0}^{Q} a_{k,q} y(n-q) |y(n-q)|^{k-1} \qquad (2)$$

Where y is calculated according to equation (1), k is a non-linear order, and l is a memory order. The coefficients $a_{kq}$ can be determined based on a UMM waveform (also generally referred to as an extraction waveform) constructed according to certain criteria. With reference back to FIG. 5, by applying the extraction waveform using signal generator 105 to the power amplifier (e.g., DUT) using the memory model extraction hardware 110, a UMM power amplifier model 120 can be extracted. For improved performance the equation (generalized memory polynomial) in (1) can be used instead of (2).

Figure 8:
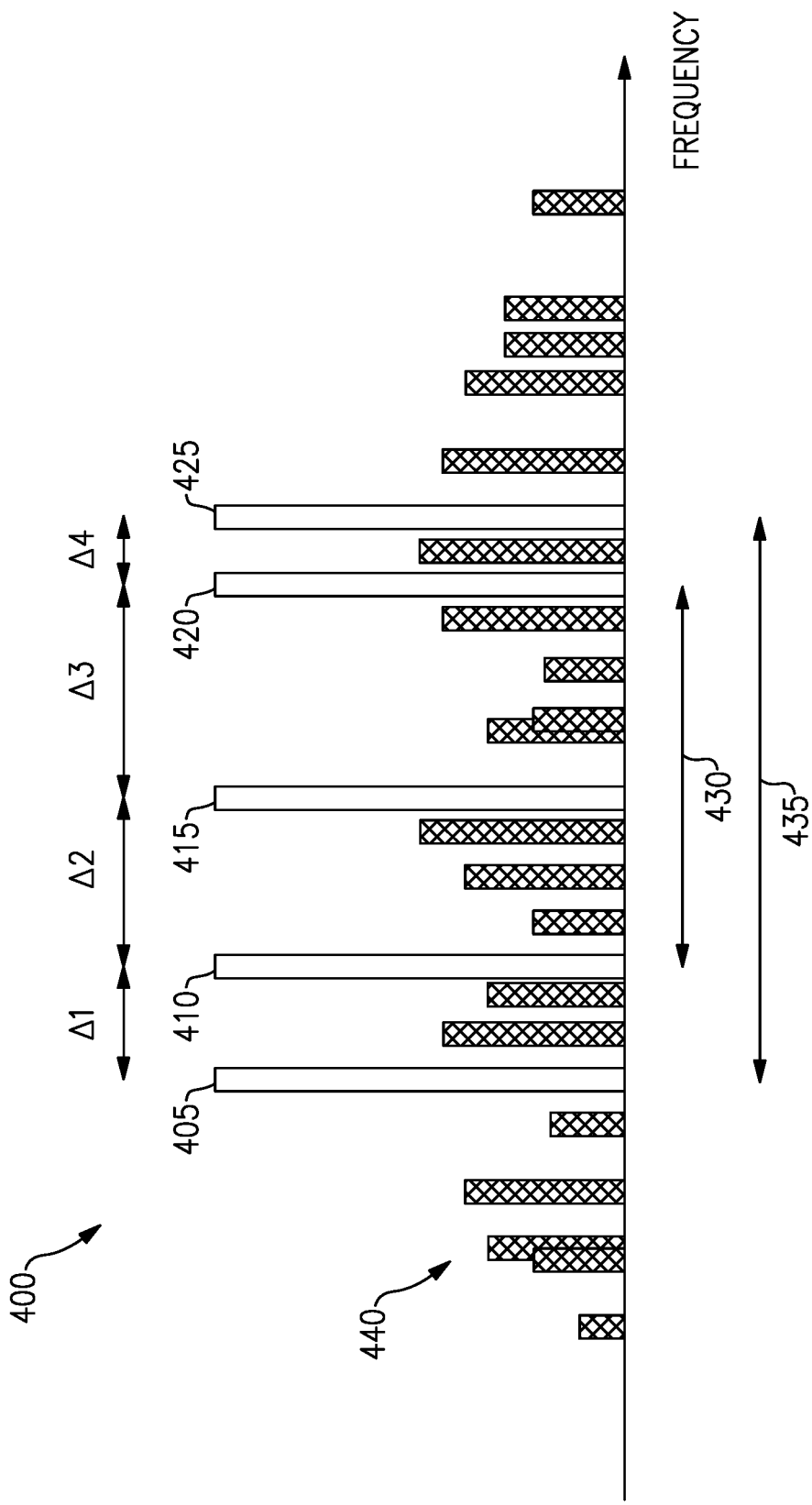
FIG. 8 is a schematic diagram of one example of a UMM waveform according to certain embodiments.

FIG. 8 is a schematic diagram of one example of a UMM waveform according to certain embodiments. In particular, the example extraction waveform of FIG. 8 illustrates a number of desirable characteristics of the extraction waveform which, when used as an input waveform for extraction of a UMM power amplifier model, addresses a number of the limitations the AMAM/AMPM model and Adaptive Memory model techniques. For example, the UMM technique may work for input signals having a generic waveform (e.g., waveforms having different characteristics from the extraction waveform used to extract the power amplifier model). The UMM model may also be accurate over a wide bandwidth when used for DPD.

As shown in FIG. 8, the extraction waveform 400 includes a plurality of tones 405-425. The tones 405-425 may be modulated narrowband tones or continuous wave tones. One characteristic of the extraction waveform 400 is the bandwidth 435 of the extraction waveform 400 is greater than the maximum bandwidth 430 of the expected input signals to the power amplifier. One advantage of being able to use an extraction waveform with a larger bandwidth is that the accuracy near the edge of the waveform band improves while in Adaptive Memory DPD only the same bandwidth can be used for extraction, losing the advantage. During extraction of the UMM model, the extraction waveform 400 is sampled at the same rate as the actual sample rate of the input signal waveform. Another characteristic is the peak-to-average ratio (PAR) of the extraction waveform 400 is greater than the PAR of the expected input signal supplied to the power amplifier. A higher PAR is used to have a set of coefficients in UMM model to cover a certain range of powers. The UMM model can include multiple sets of memory coefficients, each set corresponding to each range of powers.

Another characteristic of the extraction waveform 400 relates to the spacing between the tones 405-425, illustrated as $\Delta 1$-$\Delta 4$ in FIG. 8. The spacing $\Delta 1$-$\Delta 4$ between adjacent frequency values of the tones 405-425 are all different from each other and satisfy the following equation:

$$n_1 \Delta_1 \neq n_2 \Delta_2 \neq n_3 \Delta_3 \neq n_4 \Delta_4 \qquad (3)$$

Where $n_1$, $n_2$, $n_3$, and $n_4$ are integers. As used herein, the spacing $\Delta 1$-$\Delta 4$ generally refers to the difference in frequency between the adjacent tones 405-425. The spacing $\Delta 1$-$\Delta 4$ between adjacent frequency values of the tones 405-425 may be selected according to one or more design criteria. For example, the selected spacing $\Delta 1$-$\Delta 4$ will affect the intermodulation distortion (IMD) 440 (represented by the cross-hatched signals in FIG. 8) generated at the output of the power amplifier after the extraction waveform 400 is applied thereto. The spacing $\Delta 1$-$\Delta 4$ may be selected such that the IMD 440 covers the spectrum of interest (e.g., the bandwidth 435 or the maximum bandwidth 430) as thoroughly as possible without overlapping with the test waveform tones 405-425. In one implementation, this may be accomplished by selecting the spacing $\Delta 1$-$\Delta 4$ according to equation (3) above such that the spacing $\Delta 1$-$\Delta 4$ between any two tones 405-425 is not an integer multiple of any other spacing $\Delta 1$-$\Delta 4$. Further, the spacing $\Delta 1$-$\Delta 4$ may further be selected to minimize the number of IMD 440 that overlaps with any other IMD 440. These tone spacing requirements are designed to ensure the accuracy of the UMM for an arbitrary input waveform.

As discussed above, extracting a power amplifier using the extraction waveform as has a number of advantages of the AMAM/AMPM and Adaptive Memory models. For example, the accuracy and bandwidth of the UMM model are better than those of AMAM/AMPM model because the UMM technique models memory effects and is much less sensitive to transmitter/power amplifier gain variations. Additionally, the UMM technique is more robust than the Adaptive Memory model DPD technique used in mobile devices. The Adaptive Memory model is subject to convergence failure or performance degradation due to: dynamic voltage standing wave ratio (VSWR) variation, interference from other circuits of the mobile device, and time domain duplexing (TDD) challenges. The UMM technique is also cheaper and more efficient to implement than adaptive Adaptive Memory DPD. That is, UMM does not require any extra hardware or no complex digital signal processing (DSP) in mobile devices. The UMM coefficient extraction algorithm can be made sophisticated without limitation because unlike the Adaptive Memory DPD there is no limitation in the extraction hardware configuration, and the extraction condition for the power amplifier can be made substantially ideal without introducing convergence issues.

In order to implement the UMM technique for DPD, the memory DPD coefficients need to be extracted for every power amplifier device over a short period of time to be economical. The coefficients can be in the form of matrix where a set of coefficients is entered for each power level (with, for example, 1 dB resolution) used during model extraction.

In certain embodiments, the model can be created to be independent of the gain of the system by normalizing the input and output of the extraction waveform to a fixed power level. When the model is used, the same input power level, to which the DPD is applied to, can be used regardless of the particular input waveforms used and regardless of the output power levels in 3G and 4G systems, where the output powers are dBm of integers and are the same as the powers where the DPD coefficients are extracted. As will be understood by those skilled in the art, the model can adjust the relative amplitudes and phases between the input waveform samples for each power level based on the power amplifier non-linearity and memory effect. Thus, the absolute values of the input waveforms and output power levels do not affect the functionality of the model, and the model is not affected by the gain of the system. The independence of the model from the gain of the system is one benefit of the model to the DPD implementation, since the DPD model is not sensitive to the gain variation of the mobile device(s) in which the DPD model is implemented. In 5G systems where the output powers can be at fractions of dBm between two adjacent integers, the input power is adjusted by the same amount of the fraction rather than being at the fixed level without losing any advantage of being immune to gain variations.

A summary of certain aspects of each of the AMAM/AMPM model, Adaptive Memory model, and UMM with respect to modeling a power amplifier is provided in table 2 below.

TABLE 2

| | AMAM/AMPM Model | Adaptive Memory Model | Universal Memory Model |
|---|---|---|---|
| Input Bandwidth | General Narrow | Cannot be used Cannot be used | General Wide |
| Memory Effect | No | Cannot be used | Yes |
| Narrow Band Accuracy | Good | Cannot be used | Good |
| Wide Band Accuracy | Bad | Cannot be used | Good |
| Adaptation | N/A | Cannot be used | N/A |
| Loop | Open | Cannot be used | Open |
| Convergence/ Robustness | 100% | Cannot be used | 100% |
| Lab Bench Software Complexity | Simple | Cannot be used | Complex |
| Lab Bench Hardware Complexity | Simple | Cannot be used | Complex |
| Model Extraction Time | Short | Cannot be used | Long |

A summary of certain aspects of each of the AMAM/AMPM model, Adaptive Memory model, and UMM with respect to use in a DPD model is provided in table 3 below.

TABLE 3

| | AMAM/AMPM Model | Adaptive Memory Model | Universal Memory Model |
|---|---|---|---|
| Input Bandwidth | General Narrow | Specific Wide | General Wide |
| Memory Effect | No | Yes | Yes |
| Narrow Band Accuracy | Good | Good | Good |
| Model Kernel | Input based | Output based | Output based |
| Adaptation | No | Yes | No |
| Loop | Open | Closed | Open |
| Convergence/ Robustness | 100% | <100% | 100% |

TABLE 3-continued

| | AMAM/AMPM Model | Adaptive Memory Model | Universal Memory Model |
|---|---|---|---|
| Device Power Consumption | No Extra | Extra | No Extra |
| Device Software Complexity | Simple | Complex | Medium |
| Device Hardware Complexity | Simple | Complex | Simple |
| Model Extraction Time | Short | None | Long |

Figure 9:
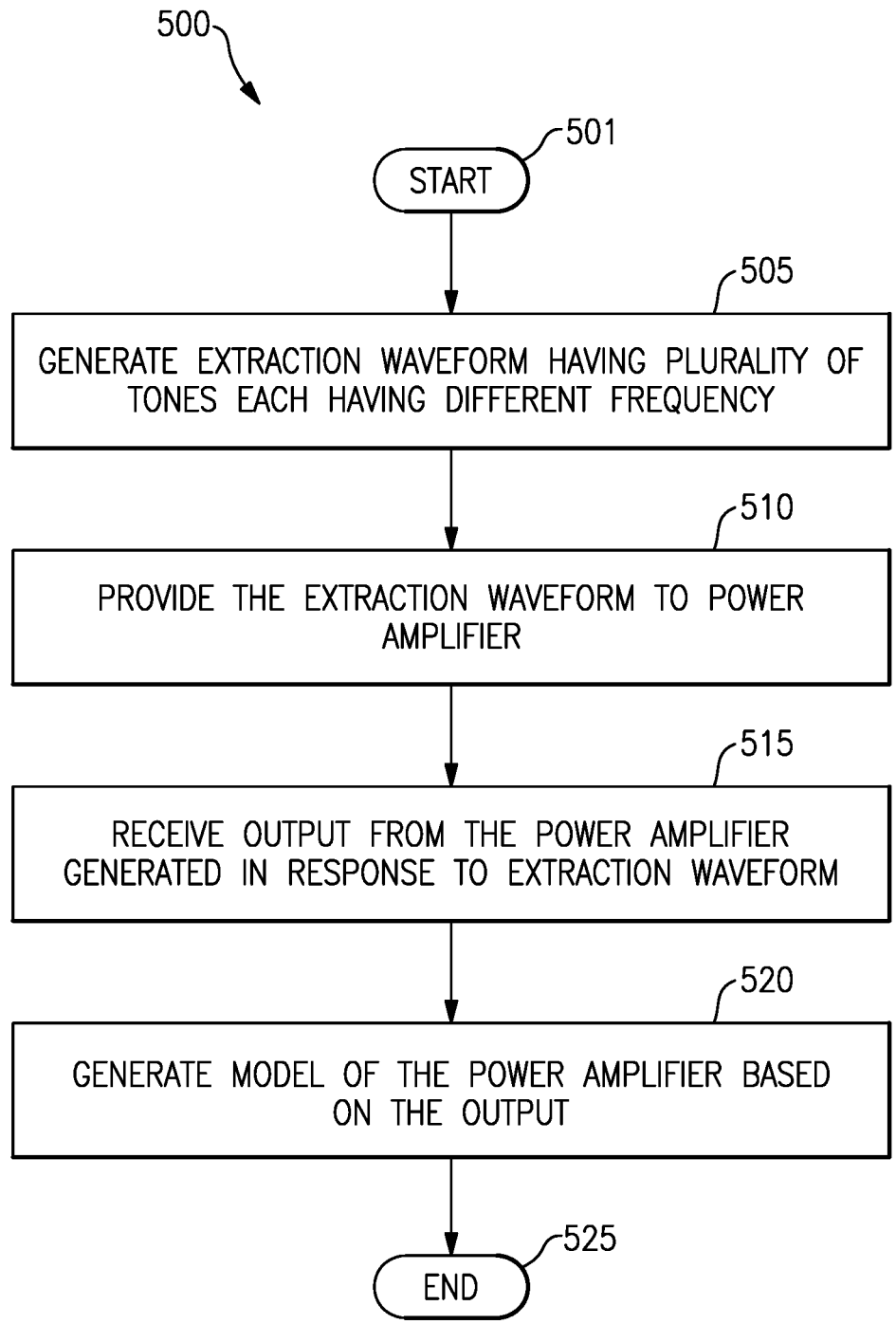
FIG. 9 is an example technique for modelling a power amplifier according to certain embodiments.

FIG. 9 is an example technique for modelling a power amplifier according to certain embodiments. The method 500 illustrated in FIG. 9 may be performed, for example, by a power amplifier modelling system, such as the systems illustrated in FIG. 5 or FIG. 6A. The method 500 begins at block 501. At block 505, the method involves generating an extraction waveform having a plurality of tones each having a different frequency. In certain implementations, the difference between the frequencies of two adjacent tones of the plurality of tones is not an integer multiple of a difference in frequency between any two other adjacent tones of the plurality of tones.

At block 510, the method 500 involves providing the extraction waveform to the power amplifier. At block 515, the method 500 involves receiving output from the power amplifier generated in response to the extraction waveform. At block 520, the method 500 involves generating a model of the power amplifier based on the output. The method 500 ends at block 525.

Attached to this disclosure is an appendix which describes aspects of the UMM techniques described herein, and which forms a part of this disclosure and is incorporated reference herein.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for modelling a power amplifier, the method comprising:
   generating an extraction waveform having a plurality of tones each having a different frequency, a difference between the frequencies of two adjacent tones of the plurality of tones not being an integer multiple of a difference in frequency between any two other adjacent tones of the plurality of tones;
   providing the extraction waveform to the power amplifier;
   receiving output from the power amplifier generated in response to the extraction waveform, the output from the power amplifier including intermodulation distortion at a plurality of different frequencies, the frequencies of the intermodulation distortion not overlapping the frequencies of the tones; and
   generating a model of the power amplifier based on the output.

2. The method of claim 1 wherein the power amplifier is configured to receive input signals having a first bandwidth, and a second bandwidth of the extraction waveform is greater than the first bandwidth.

3. The method of claim 1 wherein the power amplifier is configured to receive input signals at a sample rate that is the same as a sample rate used to generate the model of the power amplifier.

4. The method of claim 1 further comprising adjusting the difference between the frequencies of the two adjacent tones so as to reduce overlap in the frequencies of the intermodulation distortion.

5. The method of claim 1 wherein the power amplifier is configured to receive input signals having a first peak-to-average ratio, and a second peak-to-average ratio of the extraction waveform is greater than the first peak-to-average ratio.

6. The method of claim 1 further comprising:
   determining an inverse of the model of the power amplifier;
   receiving an input signal;
   applying digital pre-distortion to the input signal based on the inverse of the model of the power amplifier; and
   providing the digitally pre-distorted signal to the power amplifier.

7. The method of claim 1 wherein generating the model includes extracting the model from normalized inputs of the extraction waveform and normalized outputs of the extraction waveform at a plurality of power levels, the method further comprising:
   receiving an input signal;
   applying the model to an arbitrary input waveform at a fixed power level for 3G and 4G systems or within one dB from the fixed power level for 5G systems regardless of the output power level so as to be independent of gain.

8. A power amplifier modelling system comprising:
   a signal generator configured to generate an extraction waveform having a plurality of tones each having a different frequency, a difference between the frequencies of two adjacent tones of the plurality of tones not being an integer multiple of a difference in frequency between any two other adjacent tones of the plurality of tones;
   a power amplifier configured to receive the extraction waveform;
   model extraction hardware configured to receive output from the power amplifier generated in response to the extraction waveform, generate a model of the power amplifier based on the output, and determine an inverse of the model of the power amplifier; and
   digital pre-distortion hardware configured to receive an input signal, apply digital pre-distortion to the input signal based on the inverse of the model of the power amplifier, and provide the digitally pre-distorted signal to the power amplifier.

9. The system of claim 8 wherein the power amplifier is further configured to receive input signals having a first bandwidth, and a second bandwidth of the extraction waveform is greater than the first bandwidth.

10. The system of claim 8 wherein the power amplifier is further configured to receive input signals at a sample rate that is the same as a sample rate used by the model extraction hardware to generate the model of the power amplifier.

11. The system of claim 8 wherein the output from the power amplifier includes intermodulation distortion at a plurality of different frequencies, and the frequencies of the intermodulation distortion do not overlap the frequencies of the tones.

12. The system of claim 11 wherein the signal generator is further configured to adjust the difference between the frequencies of the two adjacent tones so as to reduce overlap in the frequencies of the intermodulation distortion.

13. The system of claim 8 wherein the power amplifier is further configured to receive input signals having a first peak-to-average ratio, and the signal generator is further configured to generate the extraction waveform having a second peak-to-average ratio that is greater than the first peak-to-average ratio.

14. A mobile device comprising:
- a modulator configured to generate a radio frequency transmit signal;
- a power amplifier configured to amplify a digitally pre-distorted radio frequency transmit signal to generate an amplified radio frequency signal;
- digital pre-distortion hardware configured to receive the radio frequency transmit signal, apply digital pre-distortion to the radio frequency transmit signal based on the inverse of a model of the power amplifier, and generate the digitally pre-distorted radio frequency transmit signal, the model of the power amplifier generated using an extraction waveform comprising a plurality of tones each having a different frequency, a difference between the frequencies of two adjacent tones of the plurality of tones not being an integer multiple of a difference in frequency between any two other adjacent tones of the plurality of tones;
- an antenna configured to receive the amplified radio frequency signal from the front end module; and
- a non-volatile memory storing the inverse of the model of the power amplifier.

15. The mobile device of claim 14 wherein the radio frequency transmit signal has a first bandwidth and a second bandwidth of the extraction waveform is greater than the first bandwidth.

16. The mobile device of claim 14 wherein the power amplifier is configured to receive the digitally pre-distorted radio frequency transmit signal at a sample rate that is the same as a sample rate used to generate the model of the power amplifier.

17. The mobile device of claim 14 wherein the output from the power amplifier comprises intermodulation distortion at a plurality of different frequencies, and the frequencies of the intermodulation distortion do not overlap the frequencies of the tones.

18. The mobile device of claim 17 wherein the model of the power amplifier is further generated by adjusting the difference between the frequencies of the two adjacent tones so as to reduce overlap in the frequencies of the intermodulation distortion.

19. The mobile device of claim 14 wherein the radio frequency transmit signal has a first peak-to-average ratio, and a second peak-to-average ratio of the extraction waveform is greater than the first peak-to-average ratio.

20. The mobile device of claim 14 wherein the digital pre-distortion hardware is further configured to extract the model from normalized inputs of the extraction waveform and normalized outputs of the extraction waveform at a plurality of power levels and apply the model to an arbitrary input waveform of the radio frequency transmit signal at a fixed power level for 3G and 4G systems or within one dB from the fixed power level for 5G systems regardless of the radio frequency transmit signal output power level so as to be independent of mobile device gain.

* * * * *